United States Patent
Hsu et al.

(10) Patent No.: US 10,937,956 B2
(45) Date of Patent: Mar. 2, 2021

(54) MAGNETORESISTIVE RANDOM ACCESS MEMORY STRUCTURE AND METHOD OF FORMING THE SAME

(71) Applicant: Taiwan Semiconductor Manufacturing Company, Ltd., Hsinchu (TW)

(72) Inventors: Chern-Yow Hsu, Chu-Bei (TW); Wei-Hang Huang, Kaohsiung (TW); Shih-Chang Liu, Alian Township (TW); Chia-Shiung Tsai, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/235,816

(22) Filed: Dec. 28, 2018

(65) Prior Publication Data
US 2019/0140169 A1   May 9, 2019

Related U.S. Application Data

(60) Continuation of application No. 15/455,720, filed on Mar. 10, 2017, now Pat. No. 10,181,558, which is a
(Continued)

(51) Int. Cl.
*H01L 43/12* (2006.01)
*H01L 43/08* (2006.01)
(Continued)

(52) U.S. Cl.
CPC .......... *H01L 43/12* (2013.01); *G11C 11/161* (2013.01); *H01L 27/1222* (2013.01);
(Continued)

(58) Field of Classification Search
None
See application file for complete search history.

(56) References Cited

U.S. PATENT DOCUMENTS 6,710,984 B1   2/2004   Yuasa et al.
7,211,446 B2 *  5/2007   Gaidis ............... H01L 43/12
                                                    438/3
(Continued)

FOREIGN PATENT DOCUMENTS

CN     102823008 A    12/2012
JP     2001160640 A    6/2001
(Continued)

*Primary Examiner* — Marcos D. Pizarro
*Assistant Examiner* — Quinton A Brasfield
(74) *Attorney, Agent, or Firm* — Slater Matsil, LLP

(57) ABSTRACT

A magnetoresistive random access memory (MRAM) structure includes a bottom electrode structure. A magnetic tunnel junction (MTJ) element is over the bottom electrode structure. The MTJ element includes an anti-ferromagnetic material layer. A ferromagnetic pinned layer is over the anti-ferromagnetic material layer. A tunneling layer is over the ferromagnetic pinned layer. A ferromagnetic free layer is over the tunneling layer. The ferromagnetic free layer has a first portion and a demagnetized second portion. The MRAM also includes a top electrode structure over the first portion.

20 Claims, 3 Drawing Sheets

Related U.S. Application Data division of application No. 13/945,534, filed on Jul. 18, 2013, now Pat. No. 9,595,661.

(51) Int. Cl.
*H01L 27/12* (2006.01)
*G11C 11/16* (2006.01)
*H01L 43/02* (2006.01)
*H01L 27/22* (2006.01)

(52) U.S. Cl.
CPC ............ *H01L 27/228* (2013.01); *H01L 43/02* (2013.01); *H01L 43/08* (2013.01)

(56) References Cited

U.S. PATENT DOCUMENTS

| | | | |
|---|---|---|---|
| 7,531,367 B2* | 5/2009 | Assefa | H01L 43/12 257/E21.665 |
| 7,989,224 B2 | 8/2011 | Gaidis | |
| 8,339,841 B2 | 12/2012 | Iwayama | |
| 2002/0167768 A1 | 11/2002 | Fontana, Jr. et al. | |
| 2004/0043526 A1* | 3/2004 | Ying | B82Y 40/00 438/38 |
| 2004/0187785 A1 | 9/2004 | Kishimoto et al. | |
| 2005/0035386 A1* | 2/2005 | Ha | H01L 43/08 257/296 |
| 2005/0277206 A1 | 12/2005 | Gaidis et al. | |
| 2007/0187785 A1* | 8/2007 | Hung | H01L 43/12 257/421 |
| 2010/0276768 A1 | 11/2010 | Gaidis | |
| 2011/0235217 A1* | 9/2011 | Chen | H01L 43/12 360/324.2 |
| 2012/0018824 A1 | 1/2012 | Lim et al. | |
| 2013/0032907 A1 | 2/2013 | Satoh et al. | |
| 2014/0042567 A1* | 2/2014 | Jung | H01L 43/08 257/421 |
| 2014/0210103 A1* | 7/2014 | Satoh | H01L 27/222 257/774 |

FOREIGN PATENT DOCUMENTS

| | | |
|---|---|---|
| JP | 5117421 B2 | 1/2013 |
| KR | 20100119493 A | 11/2010 |

\* cited by examiner

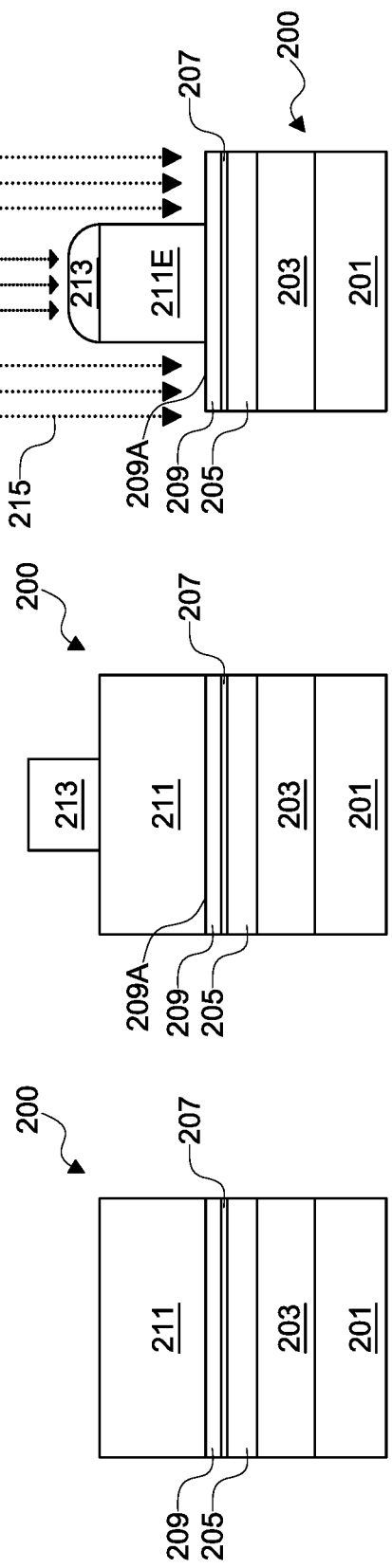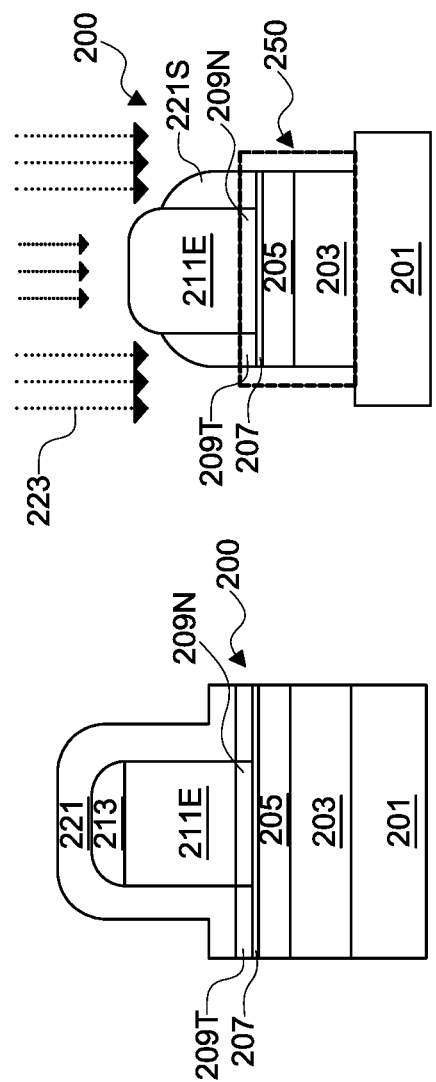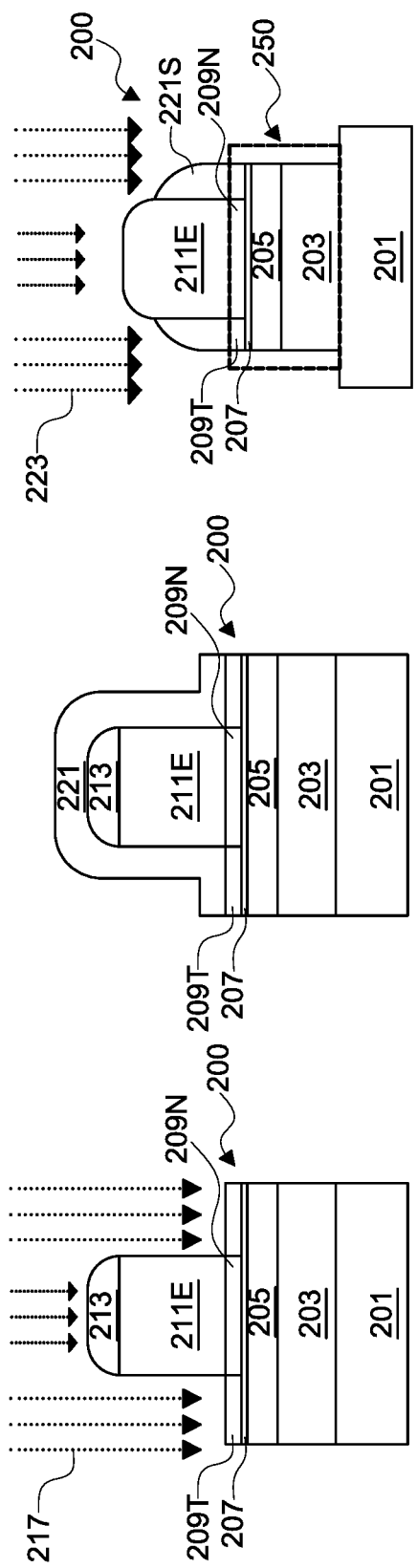

US 10,937,956 B2

MAGNETORESISTIVE RANDOM ACCESS MEMORY STRUCTURE AND METHOD OF FORMING THE SAME

PRIORITY CLAIM AND CROSS-REFERENCE

This application is a continuation of U.S. patent application Ser. No. 15/455,720 filed on Mar. 10, 2017, entitled "Magnetoresistive Random Access Memory Structure and Method of Forming the Same," which is a division of U.S. patent application Ser. No. 13/945,534 filed on Jul. 18, 2013, entitled "Magnetoresistive Random Access Memory Structure and Method of Forming the Same," now U.S. Pat. No. 9,595,661 issued on Mar. 14, 2017, which applications are hereby incorporated herein by reference.

TECHNICAL FIELD

This disclosure relates generally to a semiconductor structure and, more particularly, to a magnetoresistive random access memory structure and method of forming a magnetoresistive random access memory structure.

BACKGROUND

In integrated circuit (IC) devices, magnetoresistive random access memory (MRAM) is an emerging technology for next generation non-volatile memory devices. MRAM is a memory structure including an array of MRAM cells. A bit of data in each cell is read using resistance, rather than electronic charge. Particularly, each MRAM cell includes a magnetic tunnel junction (MTJ) element, and the resistance of the MTJ element is adjustable to represent logic "0" or logic "1". The MTJ element includes one ferromagnetic pinned layer and one ferromagnetic free layer separated by a tunneling insulating layer. The resistance of the MTJ element is adjusted by changing a direction of the magnetic moment of the ferromagnetic free layer with respect to that of the ferromagnetic pinned layer. The low and high resistances are utilized to indicate a digital signal "1" or "0", thereby allowing for data storage.

From an application point of view, MRAM has many advantages. MRAM has a simple cell structure and CMOS logic comparable processes which result in a reduction of the manufacturing complexity and cost in comparison with other non-volatile memory structures. Despite the attractive properties noted above, a number of challenges exist in connection with developing MRAM. Various techniques directed at configurations and materials of these MRAMs have been implemented to try and further improve device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2G are cross-sectional views of a MRAM structure at various stages of manufacture according to one or more embodiments of the method of FIG. 1.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a magnetoresistive random access memory (MRAM) structure is formed. The MRAM structure includes a magnetic tunnel junction (MTJ) element. The MTJ element includes a tunnel layer formed between a ferromagnetic pinned layer and a ferromagnetic free layer. The tunnel layer is thin enough (typically a few nanometers) to permit electrons to tunnel from one ferromagnetic layer to the other. A resistance of the MTJ element is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ element is in a lower resistive state, corresponding to a digital signal "0". When the magnetic moment of the ferromagnetic free layer is anti-parallel to that of the ferromagnetic pinned layer, the resistance of the MTJ element is in a higher resistive state, corresponding to a digital signal "1". The MTJ element is coupled between top and bottom electrode structures and an electric current flowing through the MTJ element (tunneling through the tunnel layer) from one electrode to the other is detected to determine the resistance and the digital signal state of the MTJ element.

According to one or more embodiments of this disclosure, the MRAM structure is formed within a chip region of a substrate. A plurality of semiconductor chip regions is marked on the substrate by scribe lines between the chip regions. The substrate will go through a variety of cleaning, layering, patterning, etching and doping steps to form the MRAM structures. The term "substrate" herein generally refers to a bulk substrate on which various layers and device elements are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

Figure 1:
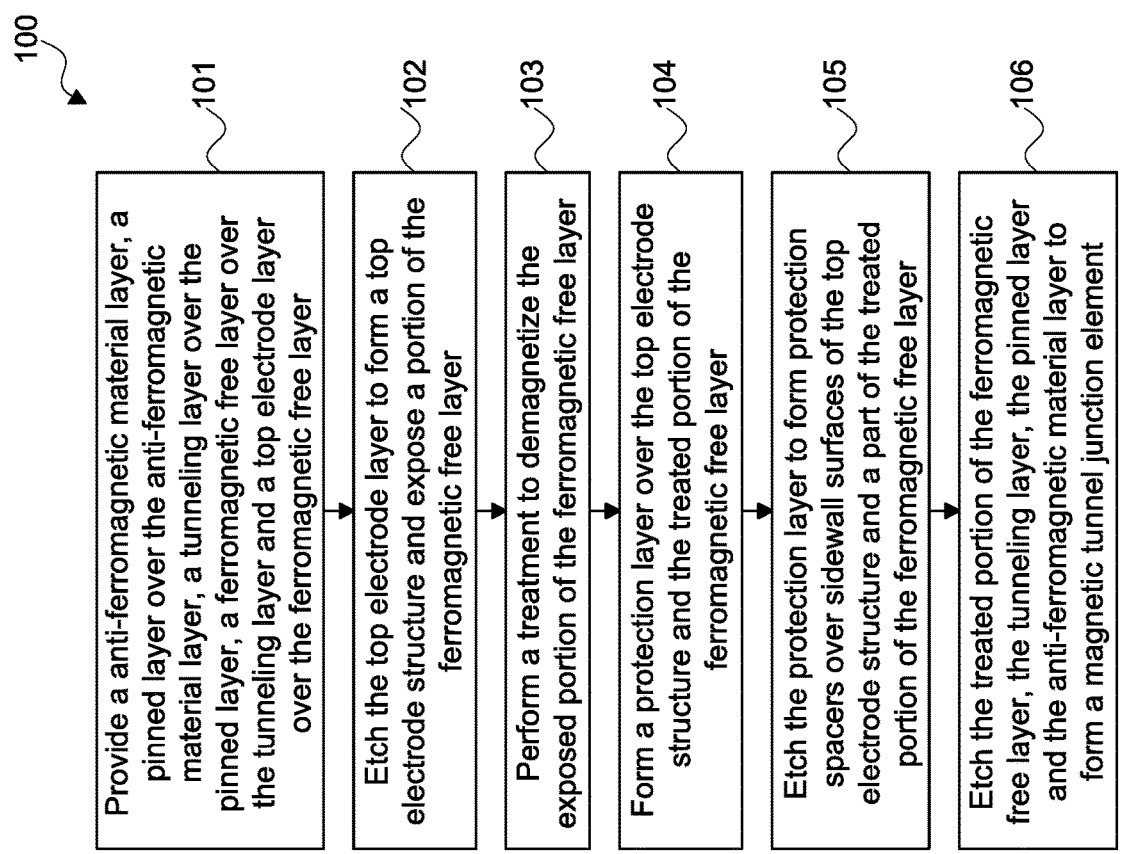
FIG. 1 is a flowchart of a method of forming a magnetoresistive random access memory (MRAM) structure according to at least one embodiment of this disclosure.

FIG. 1 is a flowchart of a method 100 of forming a semiconductor structure having a MRAM structure according to at least one embodiment of this disclosure. FIGS. 2A to 2G are cross-sectional views of a MRAM structure 200 at various stages of manufacture according to various embodiments of the method 100 of FIG. 1. Additional processes may be performed before, during, or after the method 100 of FIG. 1. Various figures have been simplified for a better understanding of the inventive concepts of the present disclosure.

Referring now to FIG. 1, the flowchart of the method 100 begins with operation 101. In at least one embodiment, a pinned layer over an anti-ferromagnetic material layer, a tunneling layer over the pinned layer, a ferromagnetic free layer over the tunneling layer and a top electrode layer over the ferromagnetic free layer are provided. The anti-ferromagnetic material layer is formed over a bottom electrode structure. The bottom electrode structure is formed over a conductive plug embedded in a dielectric layer, which is over a substrate.

Referring to FIG. 2A, which is a cross-sectional view of a portion of a MRAM structure 200 after performing operation 101. The MRAM structure 200 includes a substrate (not shown).

A conductive plug (not shown) is formed embedded in a dielectric layer (not shown) over the substrate. In some embodiments, the conductive plug includes aluminum, aluminum alloy, copper, copper alloy, titanium, titanium nitride, tantalum, tantalum nitride, tungsten, metal silicide, silicon or combinations thereof. The dielectric layer comprises silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof. In some embodiments, the formation process includes chemical vapor deposition (CVD), atomic layer deposition (ALD), high density plasma CVD (HDPCVD) or spin-on glass (SOG).

A bottom electrode structure 201 is formed over a top surface of the dielectric layer and electrically contacts the conductive plug. The bottom electrode structure 201 includes a conductive material. In some embodiments, the bottom electrode structure 201 comprises titanium (Ti), tantalum (Ta), platinum (Pt), ruthenium (Ru), tungsten (W), aluminum (Al), copper (Cu) or combinations thereof. Possible formation methods of the bottom electrode structure 201 include sputtering, PVD or ALD. In some embodiments, the bottom electrode structure 201 is electrically connected to an underlying electrical component, such as a transistor, through the conductive plug.

Still referring to FIG. 2A, an anti-ferromagnetic material (AFM) layer 203 is formed over the bottom electrode structure 201. In the anti-ferromagnetic material (AFM) layer 203, magnetic moments of atoms (or molecules) align in a regular pattern with magnetic moments of neighboring atoms (or molecules) in opposite directions. A net magnetic moment of the AFM layer 203 is zero. In certain embodiments, the AFM layer 203 includes platinum manganese (PtMn). In some embodiments, the AFM layer 203 includes iridium manganese (IrMn), rhodium manganese (RhMn), or iron manganese (FeMn). Possible formation methods of the AFM layer 203 include sputtering, PVD or ALD. The AFM layer 203 has a thickness in a range from about 100 Å to about 200 Å.

A ferromagnetic pinned layer 205 is formed over the AFM layer 203. The ferromagnetic pinned layer 205 forms a permanent magnet and exhibits strong interactions with magnets. A direction of a magnetic moment of the ferromagnetic pinned layer 205 is pinned by the adjacent AFM layer 203 and is not changed during operation of its associated magnetic tunnel junction (MTJ) element of the MRAM structure 200. In certain embodiments, the ferromagnetic pinned layer 205 includes cobalt-iron-boron (CoFeB). In some embodiments, the ferromagnetic pinned layer 205 includes CoFeTa, NiFe, Co, CoFe, CoPt, or the alloy of Ni, Co and Fe. Possible formation methods of the ferromagnetic pinned layer 205 include sputtering, PVD or ALD. In at least one embodiment, the ferromagnetic pinned layer 205 includes a multilayer structure.

A tunneling layer 207 is formed over the ferromagnetic pinned layer 205. The tunneling layer 207 is thin enough that electrons are able to tunnel through the tunneling layer when a biasing voltage is applied on the MRAM structure 200. In certain embodiments, the tunneling layer 207 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). The tunneling layer 207 has a thickness in a range from about 5 Å to about 30 Å. Possible formation methods of the tunneling layer 207 include sputtering, PVD or ALD.

Still referring to FIG. 2A, the MRAM structure 200 includes a ferromagnetic free layer 209 formed over the tunneling layer 207. A direction of a magnetic moment of the ferromagnetic free layer 205 is not pinned because there is no anti-ferromagnetic material adjacent the ferromagnetic free layer 209. Therefore, the magnetic orientation of this layer is adjustable, thus the layer is referred to as a free layer. In at least one embodiment, the direction of the magnetic moment of the ferromagnetic free layer 209 is free to rotate parallel or anti-parallel to the pinned direction of the magnetic moment of the ferromagnetic pinned layer 205. The ferromagnetic free layer 209 may include a ferromagnetic material similar to the material in the ferromagnetic pinned layer 205. In certain embodiments, the ferromagnetic free layer 209 includes cobalt, nickel, iron or boron. Possible formation methods of the ferromagnetic free layer 209 include sputtering, PVD or ALD.

The MRAM structure 200 includes a top electrode layer 211 formed over the ferromagnetic free layer 209. The top electrode layer 211 includes a conductive material. In some embodiments, the top electrode layer 211 is similar to the bottom electrode structure 201 in terms of composition. In some embodiments, the top electrode layer 211 comprises titanium (Ti), tantalum (Ta), platinum (Pt), ruthenium (Ru), tungsten (W), aluminum (Al), copper (Cu) or combinations thereof. The top electrode layer 211 provides electrical connection from the MRAM structure 200 to other portions through interconnect structure for electrical routing.

Referring to FIG. 2B, a patterned mask layer 213 is formed over the top electrode layer 211. In certain embodiments, the patterned mask layer 213 includes a dielectric material such as oxide, nitride or oxy-nitride. The patterned mask layer 213 is formed by a suitable process, including deposition, lithography patterning, and etching processes. The patterned mask layer 213 is used as an etching mask to define a top electrode structure.

Referring back to FIG. 1, method 100 continues with operation 102. In operation 102, the top electrode layer is etched to form a top electrode structure and to expose a portion of the ferromagnetic free layer.

Referring to FIG. 2C, which is a cross-sectional view of a portion of the MRAM structure 200 after performing operation 102. An etching process 215 is performed to define a top electrode structure 211E and remove the top electrode layer 211 not covered by the patterned mask layer 213. The etching process 215 may stop at a top surface of the ferromagnetic free layer 209 and a portion of the ferromagnetic free layer 209 is exposed after the etching process 215. The top electrode structure 211E has sidewall surfaces. In some embodiments, a part of the patterned mask layer 213 is consumed during the etching process 215 and a remaining patterned mask layer 213 is left for the following processes.

Referring back to FIG. 1, method 100 continues with operation 103. In operation 103, a treatment is performed to demagnetize the exposed portion of the ferromagnetic free layer.

Referring to FIG. 2D, which is a cross-sectional view of a portion of the MRAM structure 200 after performing operation 103. A treatment 217 is performed on the exposed portion 209T of the ferromagnetic free layer. The treatment 217 demagnetizes the exposed portion 209T of the ferromagnetic free layer. A portion 209N of the ferromagnetic free layer under the top electrode structure 211E is not treated with the treatment 217. The portion 209N of the ferromagnetic free layer is configurable to change a direction of a first magnetic moment with respect to a direction of a second magnetic moment of the ferromagnetic pinned layer 205. The treated portion 209T of the ferromagnetic free layer is not able to change the direction of the first magnetic moment with respect to the direction of the second magnetic moment of the ferromagnetic pinned layer 205.

In certain embodiments, the treatment 217 is performed in a plasma environment. In some embodiments, the plasma environment includes a major gas such oxygen or nitrogen. An operation pressure of the plasma environment is in a range from about 1 mini-Torr (mT) to about 1000 mT. Out of this pressure range, maintaining a stable plasma operation is difficult or the plasma is not able to ignite, in some instances. A flow of the major gas of oxygen or nitrogen in the ambience is in a range from about 5 sccm to about 500 sccm. A carrier gas (or inert gas) such as Ar, He or Xe is added, in some embodiments. In at least one example, a ratio of a flow of the carrier gas to the flow of the major gas is in a range from about 80 to about 120. Out of this flow range, demagnetizing the exposed portion 209T of the ferromagnetic free layer is difficult, or the treatment 217 will laterally damage parts of the portion 209N of the ferromagnetic free layer under the top electrode structure 211E, in some instances.

In some embodiments, the treatment 217 is performed in a thermal treatment process. In some embodiments, the treated portion 209T of the ferromagnetic free layer includes cobalt, nickel, iron, boron, oxygen or nitrogen.

Referring back to FIG. 1, method 100 continues with operation 104. In operation 104, a protection layer is formed over the top electrode structure and the treated portion of the ferromagnetic free layer.

Referring to FIG. 2E, which is a cross-sectional view of a portion of the MRAM structure 200 after performing operation 104. A protection layer 221 is blanket deposited over the patterned mask layer 213, the sidewall surfaces of top electrode structure 211E, and the treated portion 209T of the ferromagnetic free layer. The protection layer 221 includes at least one dielectric material such as silicon oxide, silicon nitride, silicon oxy-nitride or low-k dielectric. Possible formation methods of the protection layer 221 include CVD, SOG or ALD.

Referring back to FIG. 1, method 100 continues with operations 105 and 106. In operation 105, the protection layer is etched to form protection spacers over sidewall surfaces of the top electrode structure and a part of the treated portion of the ferromagnetic free layer. In operation 106, the treated portion of the ferromagnetic free layer, the tunneling layer, the pinned layer and the anti-ferromagnetic material layer are etched to form a magnetic tunnel junction element. In some embodiments, the operations 105 and 106 are performed in a same assembly having different process chambers without exposing the magnetic tunnel junction element to an external environment, such as air, between the operations 105 and 106.

Referring to FIG. 2F, which is a cross-sectional view of a portion of the MRAM structure 200 after performing operations 105 and 106. An etching process (not shown) is performed to etch the protection layer 221 and remove most part of the protection layer 221 over the treated portion 209T of the ferromagnetic free layer. Protection spacers 221S are formed over the sidewall surfaces of the top electrode structure 211E and a part of the treated portion 209T of the ferromagnetic free layer. In some embodiments, the patterned mask layer 213 is consumed in this etching process and a top surface of the top electrode structure 211E is exposed.

Still referring to FIG. 2F, which is a cross-sectional view of a portion of the MRAM structure 200 after performing operation 106. An etching process 223 is performed to etch the treated portion 209T of the ferromagnetic free layer, the tunneling layer 207, the ferromagnetic pinned layer 205 and the AFM layer 203 to form a magnetic tunnel junction (MTJ) element 250. In some embodiments, the etching process 223 is performed in a plasma environment. Portions of layers 209, 207, 205 and 203 which are not covered by the protection spacers 221S and the top electrode structure 211E are removed. The protection spacers 221S are used as an etching mask to form the MTJ element 250A, sidewall surface of the protection spacers 221S is substantially aligned with a sidewall surface of the MTJ element 250. The MTJ element 250 includes the AFM layer 203, the ferromagnetic pinned layer 205, the tunneling layer 207, the portion 209N (also referred as a functional portion 209N) of the ferromagnetic free layer under the top electrode structure 211E and the treated portion 209T (also referred as a non-functional portion 209T) of the ferromagnetic free layer. The non-functional portion 209T of the ferromagnetic free layer extends beyond an edge of the top electrode structure 211E.

Advantageously, the functional portion 209N of the ferromagnetic free layer is surrounded by the non-functional portion 209T and is isolated from the plasma environment during formation of the MTJ element 250. The magnetic characteristics of the functional portion 209N are not degraded due to plasma attack in the etching process 223 for the MTJ element 250 formation, in some embodiments. The electrical characteristic stability for the MRAM structure 200 is enhanced due to maintaining the magnetic characteristics of the functional portion 209N.

Figure 2G:
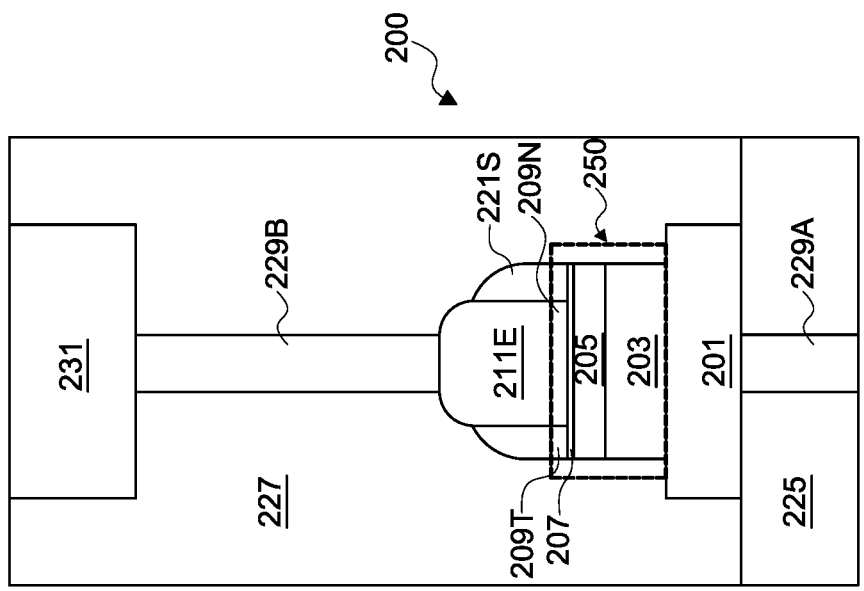

FIG. 2G is a cross-sectional view of the MRAM structure 200 optionally formed after performing operation 106. The MRAM structure 200 further includes a dielectric layer 225 and a conductive plug 229A under the bottom electrode structure 201. An inter-metal dielectric (IMD) layer 227 is formed over the MRAM structure 200 shown in FIG. 2F. In some embodiments, the IMD layer 227 surrounds the MRAM structure 200. A chemical mechanical polishing (CMP) process is further applied to the MRAM structure 200 to planarize the IMD layer 227. The IMD layer 227 includes multiple dielectric layers, in some embodiments. In some embodiments, the IMD layer 227 comprises silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof.

In certain embodiments, a dual damascene process is performed in the IMD layer 227 to form a conductive wire 231 and a conductive plug 229B which electrically contacts the top electrode structure 211E. A conductive material of the conductive wire 231 and the conductive plug 229B includes copper, copper alloys, aluminum or tungsten.

In an embodiment, a method includes: providing a magnetoresistive random access memory (MRAM) structure including: an anti-ferromagnetic material layer; a pinned layer over the anti-ferromagnetic material layer; a tunneling layer over the pinned layer; a ferromagnetic free layer over the tunneling layer, the ferromagnetic free layer having a first portion and a second portion; and a first electrode layer over the ferromagnetic free layer; patterning the first electrode layer to expose the second portion of the ferromagnetic free layer, remaining portions of the first electrode layer on the first portion of the ferromagnetic free layer forming a first electrode structure; treating the second portion of the ferromagnetic free layer to demagnetize the second portion of the ferromagnetic free layer; forming protection spacers on the second portion of the ferromagnetic free layer; and patterning the ferromagnetic free layer, the tunneling layer, the pinned layer, and the anti-ferromagnetic material layer using the protection spacers and the first electrode structure as an etch mask.

In some embodiments of the method, the MRAM structure further includes: a second electrode layer under the anti-ferromagnetic material layer; a first dielectric layer under the second electrode layer; and a first conductive plug extending through the first dielectric layer to electrically and physically couple the second electrode layer. In some embodiments, the method further includes: forming a second dielectric layer over the first electrode structure and the first dielectric layer; and forming a second conductive plug through the second dielectric layer to electrically and physically couple the first electrode structure, the patterned ferromagnetic free layer, the patterned tunneling layer, and the patterned pinned layer being electrically interposed between the first conductive plug and the second conductive plug. In some embodiments of the method, treating the second portion of the ferromagnetic free layer includes treating the second portion of the ferromagnetic free layer in a plasma environment, the plasma environment including a precursor gas and a carrier gas. In some embodiments of the method, the precursor gas includes oxygen or nitrogen. In some embodiments, the method further includes: flowing the precursor gas to the plasma environment at a flow rate of from about 5 sccm to about 500 sccm. In some embodiments of the method, the carrier gas includes an inert gas. In some embodiments, the method further includes: flowing the carrier gas to the plasma environment, a ratio of a flow rate of the carrier gas to the flow rate of the precursor gas being from about 80 to about 120. In some embodiments of the method, treating the second portion of the ferromagnetic free layer includes treating the second portion of the ferromagnetic free layer with a thermal treatment.

In an embodiment, a method includes: providing a magnetoresistive random access memory (MRAM) structure including: an anti-ferromagnetic material layer; a pinned layer over the anti-ferromagnetic material layer; a tunneling layer over the pinned layer; and a ferromagnetic free layer over the tunneling layer; forming a first electrode structure covering a first portion of the ferromagnetic free layer; demagnetizing a second portion of the ferromagnetic free layer, the second portion surrounding the first portion; depositing a protection layer over the first electrode structure and the second portion of the ferromagnetic free layer; etching the protection layer to remove the protection layer from over the first electrode structure, remaining portions of the protection layer forming protection spacers over the second portion of the ferromagnetic free layer; and patterning the ferromagnetic free layer, the tunneling layer, the pinned layer, and the anti-ferromagnetic material layer using the protection spacers and the first electrode structure as an etch mask. In some embodiments of the method, the demagnetizing the second portion of the ferromagnetic free layer is performed in a plasma environment including a first precursor and a carrier gas. In some embodiments of the method, the first precursor is oxygen or nitrogen. In some embodiments of the method, a flow rate of the first precursor is from about 5 sccm and about 500 sccm. In some embodiments of the method, a ratio of a flow rate of the carrier gas to a flow rate of the first precursor is between about 80 to about 120. In some embodiments of the method, the demagnetizing a second portion of the ferromagnetic free layer is performed with a thermal treatment.

In an embodiment, a method includes: patterning an electrode material to expose a first portion of a ferromagnetic free layer, remaining portions of the electrode material forming a first electrode structure on a second portion of the ferromagnetic free layer, the first portion surrounding the second portion; plasma-treating the first portion of the ferromagnetic free layer to demagnetize the first portion; depositing a protection spacer layer over the first portion of the electrode material; patterning the protection spacer layer to form a protective spacer around the first electrode structure and over the first portion of the electrode material; and after patterning the protection spacer layer, patterning the ferromagnetic free layer using the protection spacer as a mask.

In some embodiments of the method, the plasma-treating the first portion of the ferromagnetic free layer includes exposing the first portion of the ferromagnetic free layer to an oxygen-based or nitrogen-based plasma in an environment including a precursor gas and a carrier gas. In some embodiments of the method, the plasma-treating the first portion of the ferromagnetic free layer is performed in an environment including a precursor gas and a carrier gas. In some embodiments of the method, the precursor gas is flowed into the environment at a first flow rate and the carrier gas is flowed into the environment at a second flow rate, the first flow rate being from about 5 sccm and about 500 sccm, a ratio of the second flow rate to the first flow rate being from about 80 to about 120. In some embodiments of the method, the plasma-treating the first portion of the ferromagnetic free layer is performed in a pressure of between about 1 mT and about 1000 mT.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    providing a magnetoresistive random access memory (MRAM) structure comprising:
        an anti-ferromagnetic material layer;
        a pinned layer over the anti-ferromagnetic material layer;
        a tunneling layer over the pinned layer;
        a ferromagnetic free layer over the tunneling layer, the ferromagnetic free layer having a first portion and a second portion; and
        a first electrode layer over the ferromagnetic free layer;
    patterning the first electrode layer to expose the second portion of the ferromagnetic free layer, remaining portions of the first electrode layer on the first portion of the ferromagnetic free layer forming a first electrode structure;

treating the second portion of the ferromagnetic free layer to demagnetize the second portion of the ferromagnetic free layer;

forming a protection spacer on the second portion of the ferromagnetic free layer, the protection spacer having a curved surface;

patterning the ferromagnetic free layer, the tunneling layer, the pinned layer, and the anti-ferromagnetic material layer using the protection spacer and the first electrode structure as an etch mask, wherein after patterning the ferromagnetic free layer, the curved surface of the protection spacer extends from a sidewall of the first electrode structure to a sidewall of the second portion of the patterned ferromagnetic free layer; and after patterning the ferromagnetic free layer, forming a first dielectric layer on a top surface of the first electrode structure, the first dielectric layer contacting the curved surface of the protection spacer, the sidewall of the first electrode structure, and the sidewall of the second portion of the patterned ferromagnetic free layer.

2. The method of claim 1, wherein the MRAM structure further comprises:

a second electrode layer under the anti-ferromagnetic material layer;

a second dielectric layer under the second electrode layer and the first dielectric layer; and a first conductive plug extending through the second dielectric layer to electrically and physically couple the second electrode layer.

3. The method of claim 2 further comprising:

forming a second conductive plug through the first dielectric layer to electrically and physically couple the first electrode structure, the patterned ferromagnetic free layer, the patterned tunneling layer, and the patterned pinned layer being electrically interposed between the first conductive plug and the second conductive plug.

4. The method of claim 1, wherein treating the second portion of the ferromagnetic free layer comprises treating the second portion of the ferromagnetic free layer in a plasma environment, the plasma environment comprising a precursor gas and a carrier gas.

5. The method of claim 4, wherein the precursor gas comprises oxygen or nitrogen.

6. The method of claim 5 further comprising:

flowing the precursor gas to the plasma environment at a flow rate of from about 5 sccm to about 500 sccm.

7. The method of claim 4, wherein the carrier gas comprises an inert gas.

8. The method of claim 7 further comprising:

flowing the carrier gas to the plasma environment, a ratio of a flow rate of the carrier gas to the flow rate of the precursor gas being from about 80 to about 120.

9. The method of claim 1, wherein treating the second portion of the ferromagnetic free layer comprises treating the second portion of the ferromagnetic free layer with a thermal treatment.

10. A method comprising:

providing a magnetoresistive random access memory (MRAM) structure comprising:

an anti-ferromagnetic material layer;

a pinned layer over the anti-ferromagnetic material layer;

a tunneling layer over the pinned layer; and a ferromagnetic free layer over the tunneling layer;

forming a first electrode structure covering a first portion of the ferromagnetic free layer;

demagnetizing a second portion of the ferromagnetic free layer, the second portion surrounding the first portion;

depositing a protection layer over the first electrode structure and the second portion of the ferromagnetic free layer;

etching the protection layer to remove the protection layer from a top surface of the first electrode structure, remaining portions of the protection layer forming protection spacers over the second portion of the ferromagnetic free layer; and after etching the protection layer, patterning the ferromagnetic free layer, the tunneling layer, the pinned layer, and the anti-ferromagnetic material layer using the protection spacers and the first electrode structure as an etch mask, wherein sidewalls of the first electrode structure have lower portions and upper portions, wherein the top surface of the first electrode structure and the upper portions of the sidewalls of the first electrode structure are exposed during the patterning the ferromagnetic free layer, wherein the lower portions of the sidewalls of the first electrode structure are covered by the protection spacers during the patterning the ferromagnetic free layer.

11. The method of claim 10, wherein the demagnetizing the second portion of the ferromagnetic free layer is performed in a plasma environment comprising a first precursor and a carrier gas.

12. The method of claim 11, wherein the first precursor is oxygen or nitrogen.

13. The method of claim 11, wherein a flow rate of the first precursor is from about 5 sccm and about 500 sccm.

14. The method of claim 13, wherein a ratio of a flow rate of the carrier gas to a flow rate of the first precursor is between about 80 to about 120.

15. The method of claim 10, wherein the demagnetizing the second portion of the ferromagnetic free layer is performed with a thermal treatment.

16. A method comprising:

patterning an electrode material to expose a first portion of a ferromagnetic free layer, remaining portions of the electrode material forming a first electrode structure on a second portion of the ferromagnetic free layer, the first portion surrounding the second portion;

plasma-treating the first portion of the ferromagnetic free layer to demagnetize the first portion;

depositing a protection spacer layer over and along sides of the first electrode structure;

patterning the protection spacer layer to remove portions of the protection spacer layer over the first electrode structure, wherein remaining portions of the protection spacer layer form a protective spacer around the first electrode structure and over the first portion of the ferromagnetic free layer, a height of the protective spacer being less than a height of the first electrode structure; and after patterning the protection spacer layer, patterning the ferromagnetic free layer using the protection spacer as a mask.

17. The method of claim 16, wherein the plasma-treating the first portion of the ferromagnetic free layer comprises exposing the first portion of the ferromagnetic free layer to an oxygen-based or nitrogen-based plasma.

18. The method of claim 17, wherein the plasma-treating the first portion of the ferromagnetic free layer is performed in an environment comprising a precursor gas and a carrier gas.

19. The method of claim 18, wherein the precursor gas is flowed into the environment at a first flow rate and the carrier gas is flowed into the environment at a second flow rate, the first flow rate being from about 5 sccm and about 500 sccm, a ratio of the second flow rate to the first flow rate being from about 80 to about 120.

20. The method of claim 16, wherein the plasma-treating the first portion of the ferromagnetic free layer is performed in a pressure of between about 1 mT and about 1000 mT.

\* \* \* \* \*